US006861718B2

(12) United States Patent
Sato et al.

(10) Patent No.: US 6,861,718 B2
(45) Date of Patent: Mar. 1, 2005

(54) SPIN VALVE TRANSISTOR, MAGNETIC REPRODUCING HEAD AND MAGNETIC INFORMATION STORAGE SYSTEM (75) Inventors: Rie Sato, Kanagawa-ken (JP); Koichi Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/400,569

(22) Filed: Mar. 28, 2003

(65) Prior Publication Data

US 2003/0214004 A1 Nov. 20, 2003

(30) Foreign Application Priority Data

Mar. 28, 2002 (JP) .................................... P2002-090681

(51) Int. Cl.$^7$ .......................... H01L 29/82; H01L 43/00
(52) U.S. Cl. ...................... 257/423; 257/421; 257/422; 257/424; 257/425; 257/427
(58) Field of Search ................................ 257/421, 422, 257/423, 424, 425, 427

(56) References Cited

U.S. PATENT DOCUMENTS 6,501,143 B2   12/2002   Sato et al.

OTHER PUBLICATIONS

U.S. patent appl. Ser. No. 10/400,569, Sato et al., filed Mar. 28, 2003.
U.S. patent appl. Ser. No. 10/669,007, Sato et al., filed Sep. 24, 2003.

R. Sato and K. Mizushima, *Spin–Valve transistor with an Fe/Au/Fe(001) base* Applied Physics Letters, vol. 79, No. 8, pp. 1157–1159, Aug. 20, 2001.

D.J. Monsma, J.C. Lodder, Th.J.A. Popma, and B. Dieny, *Perpendicular Hot Electron Spin–Valve Effect in a New Megnetic Field Sensor: The Spin–Valve Transistor*, Physical Review Letters, vol. 74, No. 26, pp. 5260–5263, Jun. 26, 1995.

U.S. Appl. No. 10/320,648, filed Dec. 17, 2002, Sato et al.
U.S. Appl. No. 10/400,569, filed Mar. 28, 2003, Sato et al.

*Primary Examiner*—Long Pham
(74) *Attorney, Agent, or Firm*—Oblon, Spivak, McClelland, Maier & Neustadt, P.C.

(57) ABSTRACT

A spin valve transistor, magnetic reproducing head including a spin valve transistor and a magnetic information storage system having the spin valve transistor. The spin valve transistor has a collector, a base formed on the collector, a tunnel barrier layer formed on the base and an emitter formed on the tunnel barrier layer. In one embodiment, the collector may have a first semiconductor layer of first composition and a second semiconductor layer of a different composition epitaxially grown. The base of the first spin valve transistor may be formed on the second semiconductor layer and have a magnetization pinned layer having a magnetization substantially fixed in an applied magnetic field, a nonmagnetic layer and a magnetization free layer having a magnetization free to rotate under the applied magnetic field. The emitter of a spin valve transistor of a second embodiment may include a semiconductor layer containing an oxide of transitional metal and contacting the tunnel barrier layer.

20 Claims, 10 Drawing Sheets

SPIN VALVE TRANSISTOR, MAGNETIC REPRODUCING HEAD AND MAGNETIC INFORMATION STORAGE SYSTEM

CROSS-REFERENCE TO RELATED APPLICATIONS

This application claims priority under 35 U.S.C. §119 to Japanese patent application No. P2002-090681 filed Mar. 28, 2002, the entire content of which are incorporated by reference herein.

BACKGROUND OF THE INVENTION

1. Field of the Invention

The present invention relates to a spin valve transistor, to a magnetic sensor such as a magnetic reproducing head of high-density magnetic recording, and a magnetic information storage system having the magnetic reproducing head.

2. Discussion of the Related Art

The development of magnetic heads for writing and reproducing magnetic information promotes high-density and high-speed information recording. For example, the development of Giant Magneto Resistance effect devices (GMR devices) for magnetic reproducing heads attains a small-sized large-capacity magnetic information storage system.

The GMR device has a sandwich-structured laminate film, which is called a spin valve film and has two magnetic metal layers and a nonmagnetic metal layer sandwiched between the two magnetic metal layers. In this spin valve film, one of the magnetic metal layers has substantially pinned magnetization, which is fixed in one direction in an applied magnetic field. This magnetic metal layer may be referred to as a "magnetization pinned layer" or "magnetization fixed layer." Another magnetic metal layer of the spin valve film has a magnetization, which is free to rotate/change in the applied magnetic field and this layer may be referred to as a "magnetization free layer." The magnetization of the magnetization free layer at a zero applied magnetic field is often set to be perpendicular to the magnetization of the magnetization pinned layer.

The device has two electrodes coupled to the spin valve film. The change of relative angle between the magnetization directions of the two magnetic metal layers causes a change of the device resistance. A sense current may be provided to the spin valve film via the two electrodes and a current detector or voltage detector may be coupled to the spin valve film for measurement of the resistance change of the spin valve film.

TMR (Tunneling Magneto Resistance) devices are also being developed for magnetic recording of higher density. The TMR device has a laminate film of magnetic metal layer, tunnel barrier layer and magnetic metal layer, in which a voltage is applied across the magnetic metal layers and device tunnel resistance is detected by sensing a change of the tunnel current thereof. In the TMR device, the tunnel current varies depending on the relative angle between magnetizations of the two magnetic metal layers, and the change of relative angle promotes a tunnel resistance change. A voltage or current detector may be coupled to the laminate film via a pair of electrodes for sensing the tunnel resistance change.

Further, three-terminal spin valve transistors are also being developed. The spin valve transistors are different from the two-terminal TMR devices and GMR devices and each of the transistors includes an emitter, a base and a collector. The base is usually interposed between the emitter and the collector and has several magnetic metal layers and nonmagnetic metal layer(s). The emitter and the collector of the spin valve transistor may have a semiconductor layer to form an SMS (Semiconductor-Metal-Semiconductor) structure with one of the magnetic metal layers. An MIMS (Metal-Insulating material-Metal-Semiconductor) structure and an MIMIM (Metal-Insulating material-Metal-Insulating material-Metal) structure are also studied, where insulating material (dielectric material) layer may be used as a tunnel barrier layer.

The tunnel barrier layer is interposed between the emitter and the metal layer of the base or between the collector and the metal layer of the base and comprises a dielectric material. The spin valve transistor with the tunnel barrier layer utilizes a spin tunnel phenomenon thereof, and the transistors are referred to as a spin tunnel transistors (for example, U.S. patent application Ser. No. 09/893,447).

SUMMARY OF THE INVENTION

According to a first aspect of the present invention, there is provided a spin valve transistor including a collector, a base formed on the collector, a tunnel barrier layer formed on the base, and an emitter formed on the tunnel barrier layer. The collector has a first semiconductor layer of first composition and a second semiconductor layer formed on the first semiconductor layer. The second semiconductor layer is an epitaxially growth layer of a second composition different from the first composition. The base has a magnetization pinned layer, a nonmagnetic layer and a magnetization free layer. The magnetization pinned layer has a magnetization substantially fixed in an applied magnetic field, and the magnetization free layer has a magnetization free to rotate under the applied magnetic field.

According to the first aspect of the present invention, the Schottky barrier layer formed between the base and the second semiconductor layer of the collector becomes high, thereby increasing the SN ratio of the transistor.

According to a second aspect of the present invention, there is provided a spin valve transistor including a collector, a base formed on the collector, a tunnel barrier layer of dielectric material formed on the base and an emitter formed on the tunnel barrier layer. The base has a magnetization pinned layer, a nonmagnetic layer and a magnetization free layer. The magnetization pinned layer has a magnetization substantially pinned in an applied magnetic field, and the magnetization free layer has a magnetization free to rotate in the applied magnetic field. The emitter includes a semiconductor layer which contains an oxide of transitional metal and contacts the tunnel barrier layer.

According to the second aspect of the invention, hot electrons may be injected at a lower voltage from the semiconductor layer of the emitter via the base metal/insulator barrier/semiconductor structure. The voltage reduction prevents damage to the barrier layer and increases the transfer ratio. The semiconductor layer of the spin valve transistor according to the second aspect of the present invention includes a transition metal oxide having a work function large enough to significantly transform the potential barrier of the barrier layer thereby to increase further the hot electron injection efficiency.

The spin valve transistor of the present invention may be used as a sensor of a magnetic reproducing head and a magnetic information storage system.

BRIEF DESCRIPTION OF SEVERAL VIEWS OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Referring now to the drawings, wherein like reference numerals designate identical or corresponding parts throughout the several views, the present invention is not described.

(First Embodiment)

Figure 1:
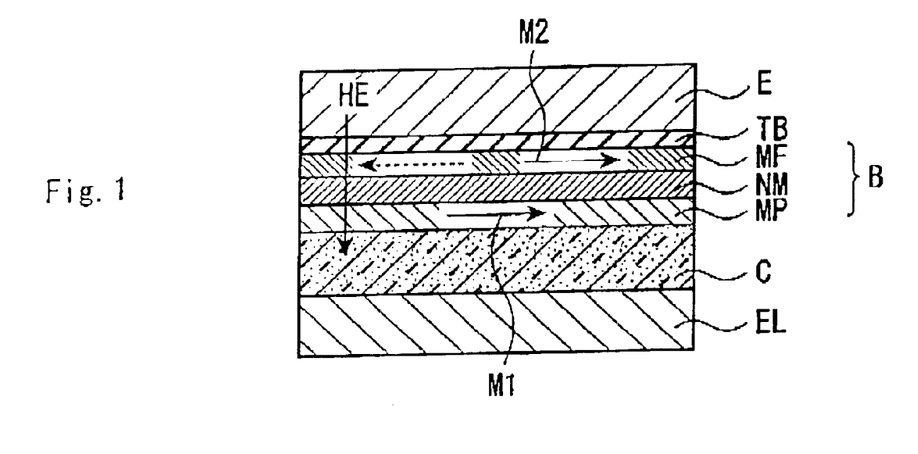
FIG. 1 is a schematic cross-sectional view showing one example of spin valve transistor studied by the present inventors.
Figure 2:
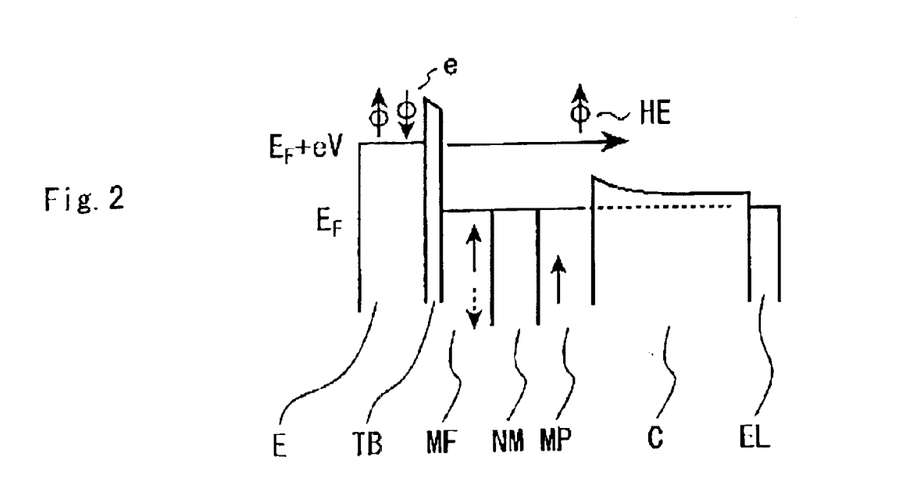
FIG. 2 is an energy diagram of the spin valve transistor of FIG. 1.

FIG. 1 is a schematic cross-sectional view, which shows one example of spin valve transistors that the present inventors have studied to reach the first aspect of the invention. FIG. 2 is an energy diagram of the spin valve transistor of FIG. 1.

The spin valve transistor of FIG. 1 includes an emitter E of a nonmagnetic metal layer, a base B of a spin valve film and a collector C of a semiconductor layer.

The base B of FIG. 1 is sandwiched between the emitter E and the collector C. The spin valve film of the base B has a laminate film of a magnetic metal layer (magnetization pinned layer) MP, a nonmagnetic metal layer NM and a magnetic metal layer MF (magnetization free layer). A tunnel barrier layer TB is provided between the emitter E and the base B. The laminate film of the emitter E, the base B and the collector C may have a flat cubic shape or other body shapes.

The magnetization pinned layer MP may have a coercive force which is larger than that of the magnetization free layer MF so that the magnetization pinned layer MP keeps its initial magnetization M1 under an applied magnetic field while the magnetization M2 of the magnetization free layer MF may change under the applied magnetization.

When a voltage is applied to the tunnel junction, electrons e are injected from the emitter E to the base B through the tunnel barrier layer TB and hot electrons HE in FIG. 2 are formed. An energy that each electron e has is the sum of the Fermi energy $E_F$ and eV. The hot electron HE having the energy scatters in the base B depending on its spin direction, and the collector current greatly varies in accordance with the relative angle between magnetization directions of the two magnetic layers MP and MF. The collector current of the device may be sensed by a current detector, which is coupled to the electrode EL. The collector current change results from the magneto resistance effect of the hot electrons, whereby the sensitivity of the device is higher than that of GMR and TMR devices.

When the device is made smaller in size to increase the recording density of the spin valve transistors an output current may become lower, whereby a stray capacitance of the sensor circuit may become large with the effect that the circuit operation speed may be lowered.

Figure 3:
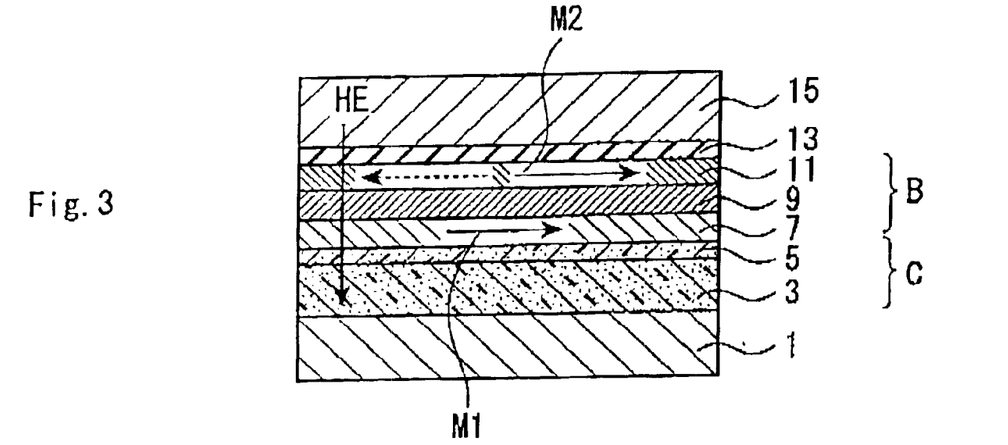
FIG. 3 is a schematic cross-sectional view showing a spin valve transistor according to a first embodiment of the present invention.
Figure 4:
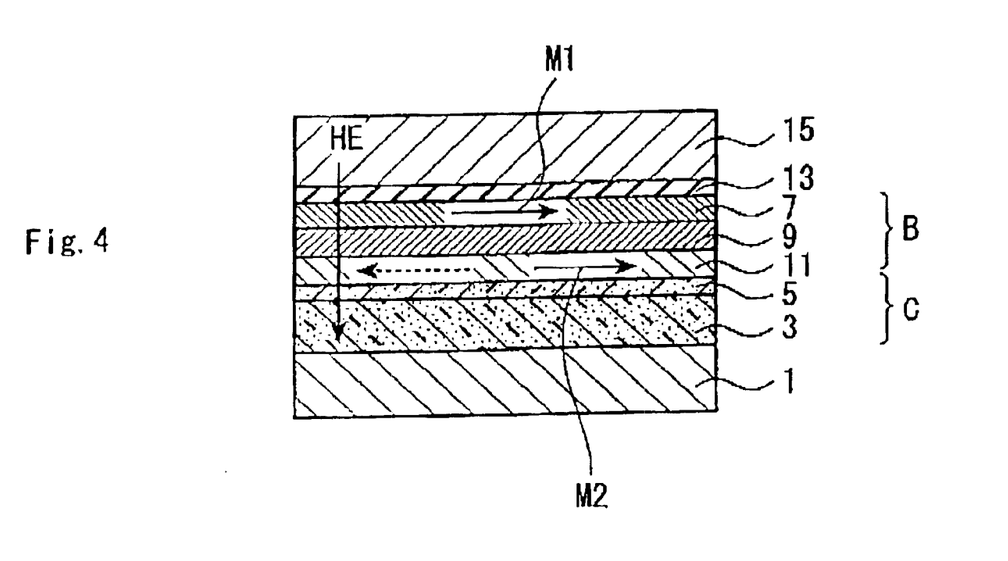
FIG. 4 is a schematic cross-sectional view showing another spin valve transistor according to the first embodiment of the present invention.
Figure 5:
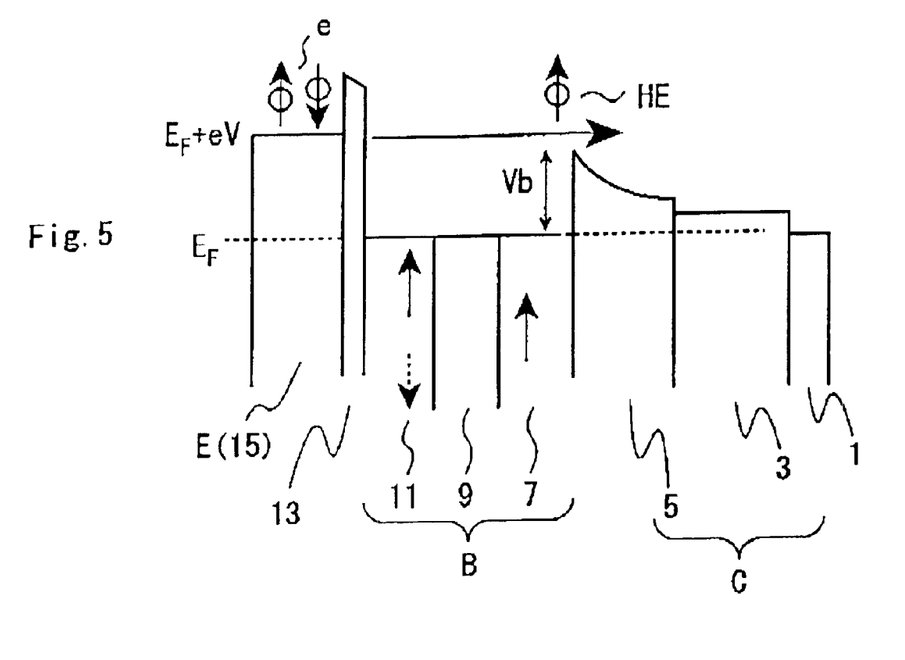
FIG. 5 is an energy diagram of the spin valve transistor of FIG. 3.

FIGS. 3 and 4 are schematic cross-sectional views, each showing a spin valve transistor of the first embodiment according to the first aspect of the invention. FIG. 5 is an energy diagram of the spin valve transistor of FIG. 3.

The spin valve transistor of the first embodiment includes an emitter E (15), a base B and a collector C, in which the base B is formed between the emitter 15 and the collector C. The collector C, the base B and the emitter E are laminated and the laminated film has a substantially flat cubic body. However, the body shape of the laminated film may be changed. The collector C is electrically coupled to an external circuit via a collector electrode 1. Each of the emitter 15 and the base B is also electrically coupled to an external circuit via each electrical terminal (not shown).

The collector C includes a first semiconductor layer 3 and a second semiconductor layer 5 which is epitaxially grown on the semiconductor layer 3. The emitter of FIG. 3 is made of a nonmagnetic metal layer 15, however, the emitter 15 may include other conductive or semiconductor materials.

The base B of FIG. 3 has a spin valve film that includes a first magnetic metal layer (magnetization pinned layer) 7, a nonmagnetic metal layer 9 and a second magnetic metal layer (magnetization free layer) 11 laminated in that order. A tunnel barrier layer 13 of a dielectric material is formed between the emitter 15 and the base B.

A coercive force difference may be provided between the magnetization pinned layer 7 and the magnetization free layer 11. The coercive force of the magnetization pinned layer 7 may be larger than that of the magnetization free layer 11 so that the magnetization M1 of the magnetization pinned layer 7 is pinned substantially in one direction. On the other hand, the coercive force of the magnetization free layer 11 is small enough so that the direction of the magnetization M2 of the layer 11 varies under the applied magnetic field (or signal magnetic field). The coercive force difference may be attained by selection of the materials of the magnetization pinned layer 7 and the magnetization free layer 11.

The magnetization M1 of the magnetization pinned layer 7 may alternatively be pinned by magnetic exchange coupling between the magnetization pinned layer 7 and an antiferromagnetic layer, which may be laminated on the magnetization pinned layer 7. Antiferromagnetic exchange coupling between the antiferromagnetic layer and the ferromagnetic layer is well known in the art, for example, as described in United States reissued Pat. No. RE37,819 and U.S. Pat. No. 5,552,949, the disclosures of which are hereby incorporated by reference as a part of this description.

FIG. 4 is a cross-sectional view of a spin valve transistor according to a modification of the first embodiment of the present invention. In this spin valve transistor of FIG. 4, the magnetization pinned layer 7 and the magnetization free layer 11 of the spin valve film are changed in their positions, where the magnetization pinned layer 11 is formed on the side of the collector C and the magnetization free layer 7 is formed on the side of the tunnel barrier layer 13.

In the spin valve transistors of FIG. 3 and FIG. 4, when hot electrons HE of FIG. 5 are injected from the emitter 15 to the base B through the tunnel barrier layer 13, the hot electrons HE scatter in the base B depending on their own spin direction, thereby significantly varying the collector current in accordance with the relative angle of the magnetization directions of the magnetization pinned layer and the magnetization free layer.

The resistance of the transistor becomes highest when the magnetization M2 of the magnetization free layer 11 is antiparallel to the magnetization M1 of the magnetization pinned layer 7 under an applied magnetic field, while the resistance of the transistor becomes the lowest when the magnetization M2 of the magnetization free layer 11 is parallel to the magnetization M1 of the magnetization pinned layer 7 under an applied magnetic field. The spin valve transistor attains high-sensitivity magnetic detection based on the magneto resistance effect of the hot electrons.

The collector current in the spin valve transistors becomes largest when the magnetization M1 of the magnetization pinned layer 7 of the spin valve film is parallel to the magnetization M2 of the magnetization free layer 11, and the collector current becomes the smaller when magnetization directions M1 and M2 are anti-parallel to each other. The collector current ratio (MR ratio) of the spin valve transistor may reach about 300% or more. The MR ratio is larger by around 10 times or more than that of GMR devices and TMR devices, and the spin valve transistors of the present invention is suitable for magnetic reproducing heads for magnetic recording of higher density.

According to the first embodiment, the epitaxially growth semiconductor layer 5 is provided between the first semiconductor layer 3 of the collector C and the base B. When the epitaxially growth layer 5 includes a semiconductor material having a larger energy band gap than that of the semiconductor layer 3, or a semiconductor material having a smaller electron affinity than that of the semiconductor layer 3, the height "$V_b$" of the Schottky barrier of FIG. 5 may become higher than the spin valve transistor which does not have the epitaxially growth layer 5. Also, the S/N ratio of the spin valve transistor according to the first embodiment may also become higher than that of the spin valve transistor which does not have the epitaxially growth layer 5.

Figure 6:
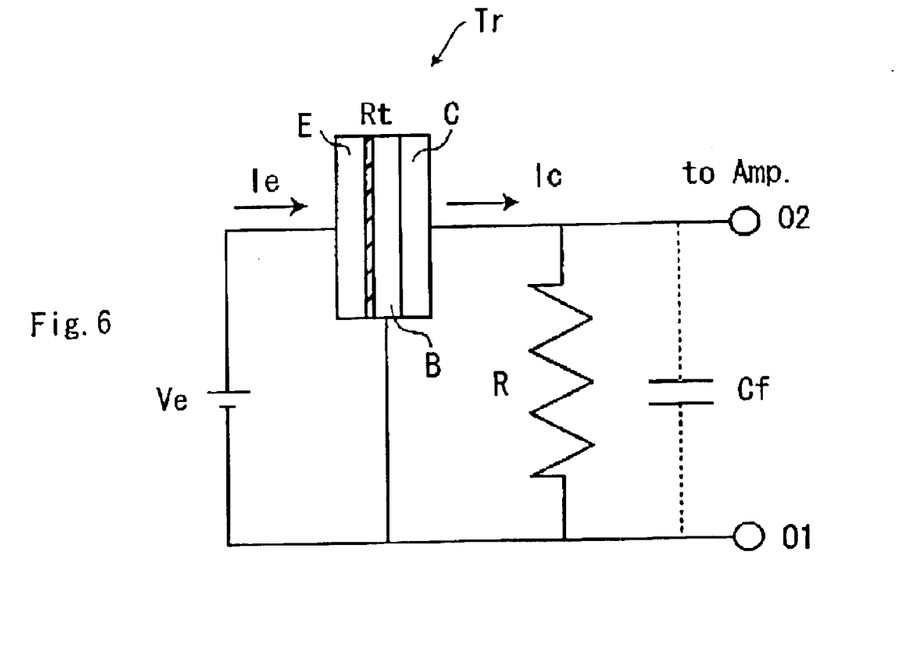
FIG. 6 is an equivalent circuit diagram of a magnetic head with a spin valve transistor.
Figure 7:
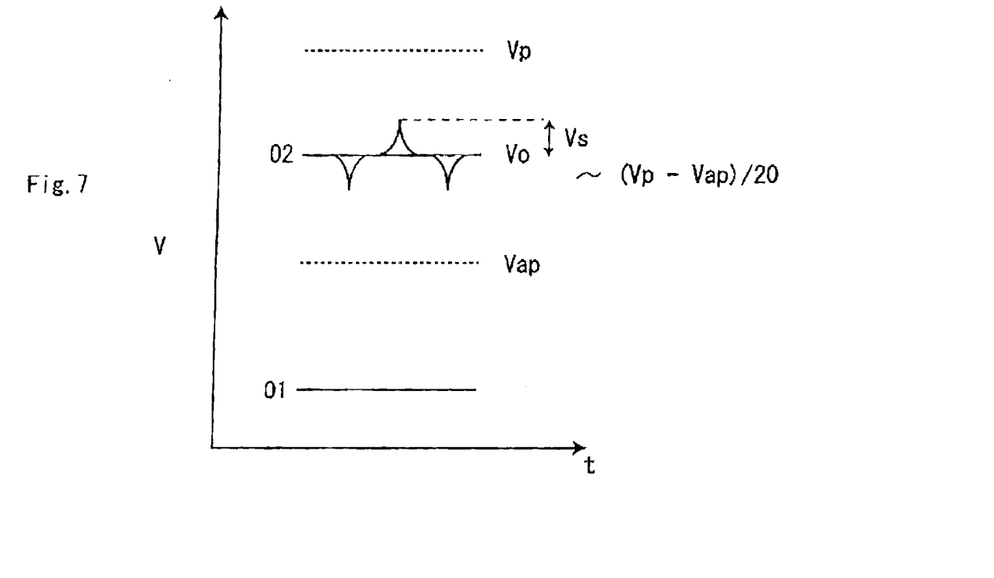
FIG. 7 is a signal diagram of output signals of the output terminals O1 and O2 of FIG. 6.

FIG. 6 is a diagram of the equivalent circuit network of a magnetic head with a spin valve transistor as a magnetic reproducing sensor FIG. 7 is a graph which shows the output signal (V) from the output terminals O1 and O2 of the circuit of FIG. 6.

In FIG. 6, $R_t$ indicates the tunnel resistance between the emitter E and the base B; R indicates the external resistance of the collector circuit; $C_f$ indicates the stray capacitance of the wiring to an amplifier Amp; $V_E$ indicates a DC voltage applied to the spin valve transistor Tr; and $I_E(=V_E/R_t)$ indicates the direct current applied to the spin valve transistor Tr. The collector circuit connects the collector and the grounded base. The output terminal O2 of FIG. 6 is electrically coupled to the amplifier Amp.

In FIG. 7, $V_o$ indicates a DC output voltage; $V_S$ indicates a signal voltage; $V_p$ indicates the signal voltage value when the magnetizations M1 and M2 of the two ferromagnetic layers are parallel to each other; and $V_{ap}$ indicates the signal voltage value when the magnetizations M1 and M2 are anti-parallel to each other.

The electric noise $V_n$ at the output terminal O1 essentially results from the current fluctuation at the tunnel junction and the thermal noise $V_t$ of the external resistance R, as in the following formula (1). $I_S$ of the formula (1) indicates the fluctuation in the tunneling current.

$$V_n = V_t + (I_S/I_E)V_o \tag{1}$$

$I_S$ may be approximated to a classical shot noise and be represented by the following formula (2) in which $\Delta f$ indicates the bandwidth and e indicates the charge of an electron.

$$I_S = (2eI_E\Delta f)^{1/2} \tag{2}$$

On the other hand, the thermal noise $V_t$ may be represented by the following formula (3) in which T indicates the environmental temperature where the transistor is used.

$$V_t = (4kTR\Delta f)^{1/2} \tag{3}$$

From these formulas, the condition of the MR ratio and the transfer ratio necessary for obtaining the SN ratio of 30 (i.e., 30 dB) is studied. The MR ratio (magneto current ratio) corresponds to the ratio $I_p/I_{ap}$ of the collector current ($I_C=I_p$) when the magnetizations M1 and M2 of the magnetization pinned layer 7 and the magnetization free layer 11 of the base B are parallel to each other, and to the collector current ($I_C=I_{ap}$) when the magnetizations M1 and M2 are anti-parallel to each other. The transfer ratio, $I_p/I_E$, corresponds to the ratio of the collector current $I_p$ to the emitter current $I_E$ when the magnetization M1 is parallel to the magnetization M2. The operation temperature T is 400 K; and the bandwidth $\Delta f$ is 300 MHz. The signal voltage $V_S$ is represented by the following formula (4):

$$V_S \approx (V_p - V_{ap})/20 \tag{4}$$

$V_o$ is represented by the following formula (5):

$$V_o = (V_p + V_{ap})/2 \tag{5}$$

Figure 8:
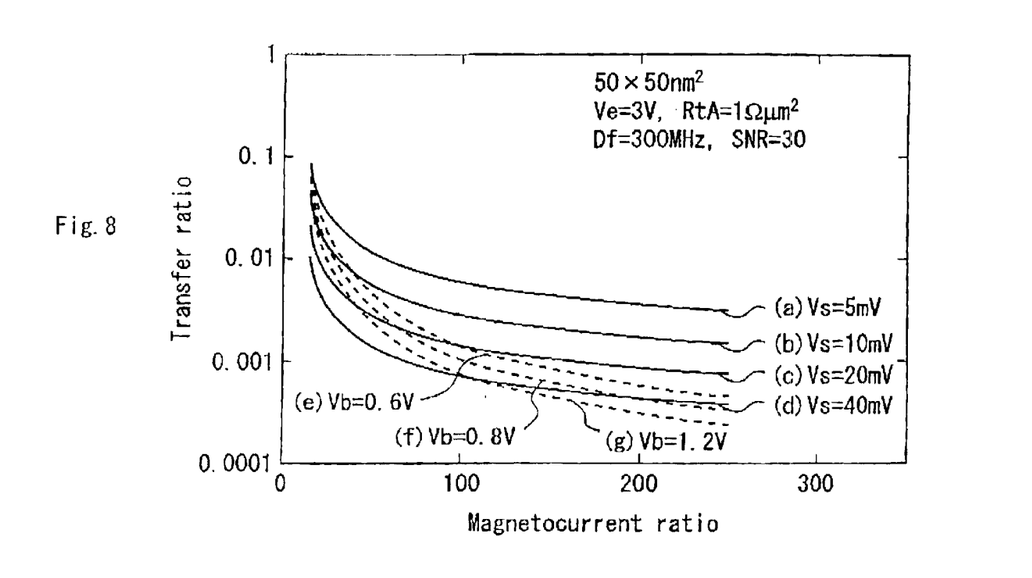
FIG. 8 is a graph illustrating a relationship between a Schottky barrier height of Schottky junction and an SN ratio.

FIG. 8 is a diagram for explaining the relationship between the MR ratio and the transfer ratio to obtain a SN ratio of 30. The horizontal axis of FIG. 8 indicates the MR ratio, and the vertical axis of FIG. 8 indicates the transfer ratio of the spin valve transistor.

A chip of a plane size A (A=50×50 nm$^2$) for a recording density of 500 gbit/inch$^2$ was evaluated and the graph of FIG. 8 shows the result. The electric resistivity Rt×A of the tunnel junction was 1 $\Omega\mu m^2$, and $V_E$ was 3 V. In the diagram, each of the solid lines (a), (b), (c) and (d) indicates the relationship between the MR ratio and the transfer ratio to give the same SN ratio of 30. Each of the solid lines (a), (b), (c) and (d) corresponds to a respective signal voltage $V_s$ ($V_s$=5 mV, 10 mV, 20 mV and 40 mV). In the diagram of FIG. 8, the transistor, which has the SN ratio larger than 30, of an output voltage of 10 mV is in the region above the solid line (b).

Similarly, the other solid lines of FIG. 8 of the other signal voltages indicate the lowermost limit of the region in which the SN ratio of the transistor is larger than 30.

It is understood from FIG. 8 that, when both the resistance R and the signal voltage $V_s$ is large, the SN ratio shall be larger than 30 at a predetermined MR ratio and at a smaller transfer ratio. Since it is difficult to enlarge the transfer ratio of spin valve transistors, it is desirable to employ a larger resistance thereby to increase the signal voltage $V_S$ for increasing the SN ratio in spin valve transistors.

The increase of the signal voltage $V_s$ may lead the increase in the DC output voltage $V_o$. When the output voltage $V_o$ becomes larger than the voltage $V_b$ that corresponds to the height of the Schottky barrier, the electrons having flowed into the collector C will form a back flow to the base B. Therefore, the uppermost limit of $V_o$ is $V_b$.

The broken lines (e), (f) and (g) of FIG. 8 each indicates the relationship between the MR ratio and the transfer ratio that satisfies the condition of SN ratio=30. $V_b$ was set at each of 0.6 V, 0.8 V and 1.2 V.

For example, when $V_b$=0.8 V, the region above the broken line (f) satisfies the condition of SN ratio>30. Similarly, the other broken lines of the other $V_b$ all indicate the lowermost line of the region in which the SN ratio is larger than 30 (SN ratio>30).

It is also understood that, when the voltage $V_b$ corresponding to the Schottky barrier becomes large, the signal voltage $V_S$ increases, whereby the region having a higher SN ratio (>30) becomes broader and a higher SN ratio can be obtained. The height of the Schottky barrier formed between metal and semiconductor is generally larger when the electron affinity of the semiconductor is smaller. A broader band gap also tends to increase the height of Schottky barrier.

Accordingly, when the epitaxially grown layer 5 having a smaller electron affinity or having a broader band gap is provided on the surface of the semiconductor layer 3 of the collector C, then the height of the Schottky barrier formed between the layer 5 and the magnetization pinned layer 7 (FIG. 3) or the magnetization free layer 11 (FIG. 4) may increase, thereby obtaining a higher SN ratio.

A single element of semiconductor material such as silicon (Si) and germanium (Ge), and various compound semiconductors such as gallium arsenide (GaAs) may be used for the semiconductor material of layer 3.

The material of the epitaxially grown layer 5 may be any of the above-mentioned single elements or compound semiconductors. As above mentioned, the epitaxially grown layer 5 is formed of a semiconductor material having a broader energy band gap than that of the semiconductor layer 3 so as to increase the height of the Schottky barrier between the epitaxially grown layer 5 and the overlying magnetic metal layer, thereby increasing the S/N ratio of the transistor. For broadening the energy band gap of the epitaxially grown layer 5, for example, a $Ga_{1-x}Al_xAs$ layer grown on a GaAs layer may have the broader energy band gap than a GaAs layer.

The magnetization pinned layer 7 and the magnetization free layer 11 may be in any form of a single layer of one magnetic metal, a laminate structure of different magnetic metal layers, or a laminate structure of a magnetic metal layer(s) and a dielectric layer(s). The magnetic metal material for the layers includes various magnetic metals such as iron (Fe), cobalt (Co) and nickel (Ni), and various magnetic alloys containing any one of iron, cobalt and nickel.

The nonmagnetic metal layer 9 inhibits magnetic coupling between the magnetization pinned layer 7 and the magnetization free layer 11. The nonmagnetic metal layer 9 forms interfaces with two magnetic metal layers, and it is preferable to choose the material of nonmagnetic metal layer 9 so that the interfaces does not scatter the hot electrons HE having an up spin. The material of the nonmagnetic metal layer 9 is therefore selected to promote these functions. The material of the nonmagnetic metal layer 9 may be, for example, copper (Cu), gold (Au), silver (Ag), rhenium (Re), osmium (Os), ruthenium (Ru), iridium (Ir), palladium (Pd), chromium (Cr), manganese (Mn), aluminum (Al), rhodium (Rh) or platinum (Pt). The nonmagnetic metal layer 9 has a thickness thick enough to block the magnetic coupling between the magnetization pinned layer 7 and the magnetization free layer 11, but thin enough not to disturb the flow of the hot electrons HE of up spin. The mean thickness of the layer 9 may fall generally between about 0.5 and about 30 nm, however the mean thickness of the layer 9 may vary depending on the material thereof.

Various oxides such as aluminum oxide ($AlO_x$) and other dielectrics such as oxides or nitrides may be used for the material of the tunnel barrier layer 13. The thickness of the tunnel barrier layer 13 may preferably thin enough to allow hot electrons HE to tunnel through the barrier layer 13.

Various metal materials such as aluminum (Al) and gold (Au), and also various semiconductor materials may be used for the emitter 15.

(Second Embodiment)

Next described is the second embodiment of the second aspect of the invention.

The tunnel barrier layer of the transistor according to the first embodiment is provided between the emitter E and the base B, and it forms a tunnel junction having a stacked structure of metal/insulator/metal (MIM). In the MIM structure, a voltage of a few volts is applied to the tunnel junction to form the hot electrons HE. When the tunnel barrier layer 13 has a thickness of not larger than about 1 nm, it may cause its durability against the high applied electric field. Schottky structure (MS structure) may be replaced with the MIM structure, however, the energy of the hot electrons of MS structure may become low and the transfer ratio may be lowered.

In this embodiment, a different structure of metal/insulator/semiconductor (MIS structure) is employed to solve the above described problems.

Figure 9:
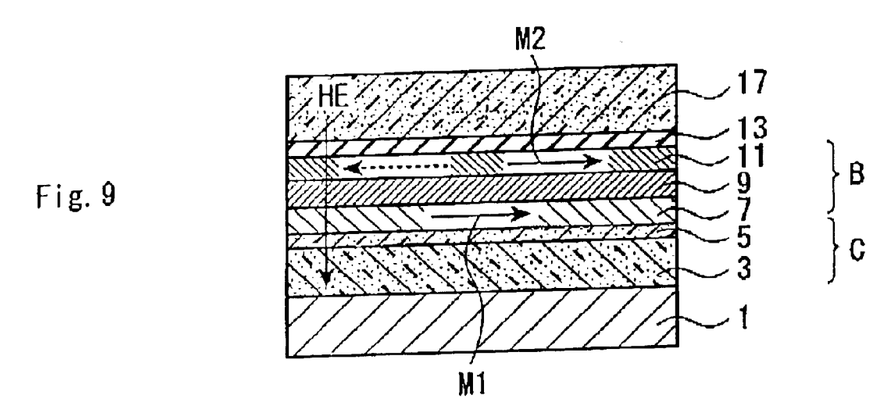
FIG. 9 is a schematic cross-sectional view of a spin valve transistor according to a second embodiment of the present invention.
Figure 10:
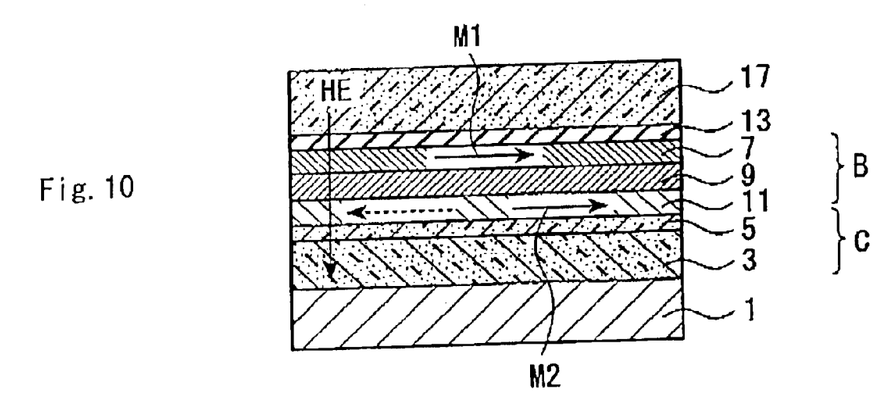
FIG. 10 is a schematic cross-sectional view of another spin valve transistor according to the second embodiment of the present invention.
Figure 11:
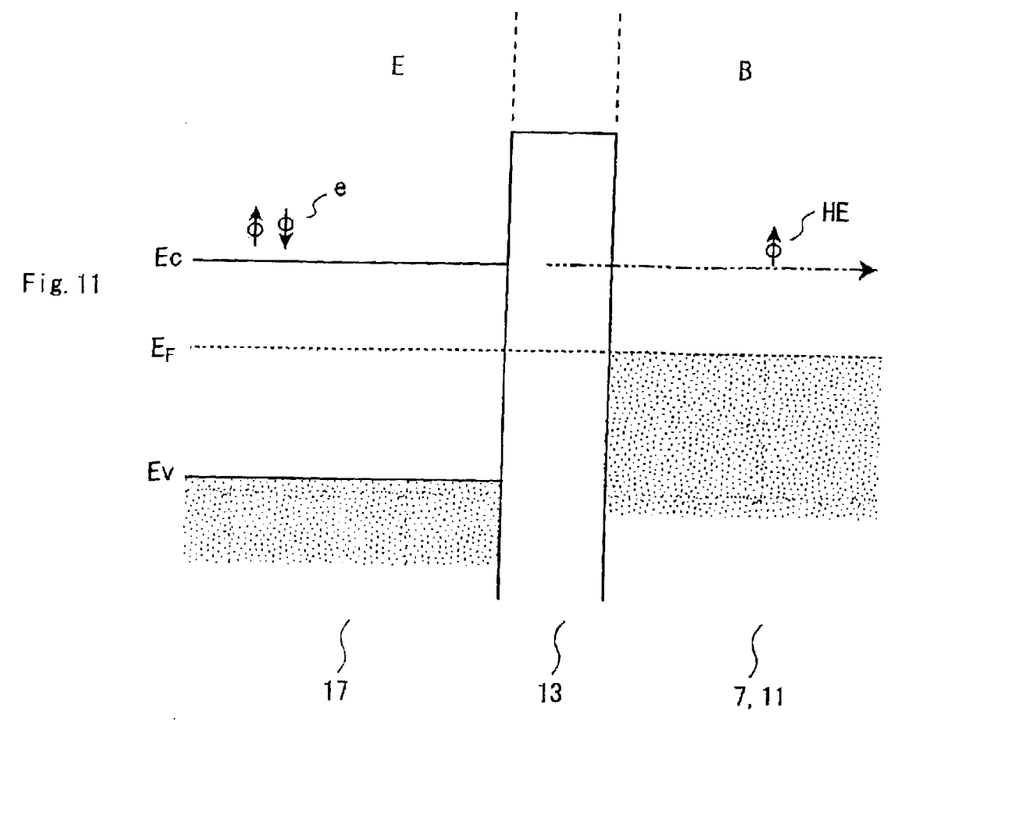
FIG. 11 is an energy band diagram around the tunnel barrier layer of the second embodiment of the present invention.
Figure 12:
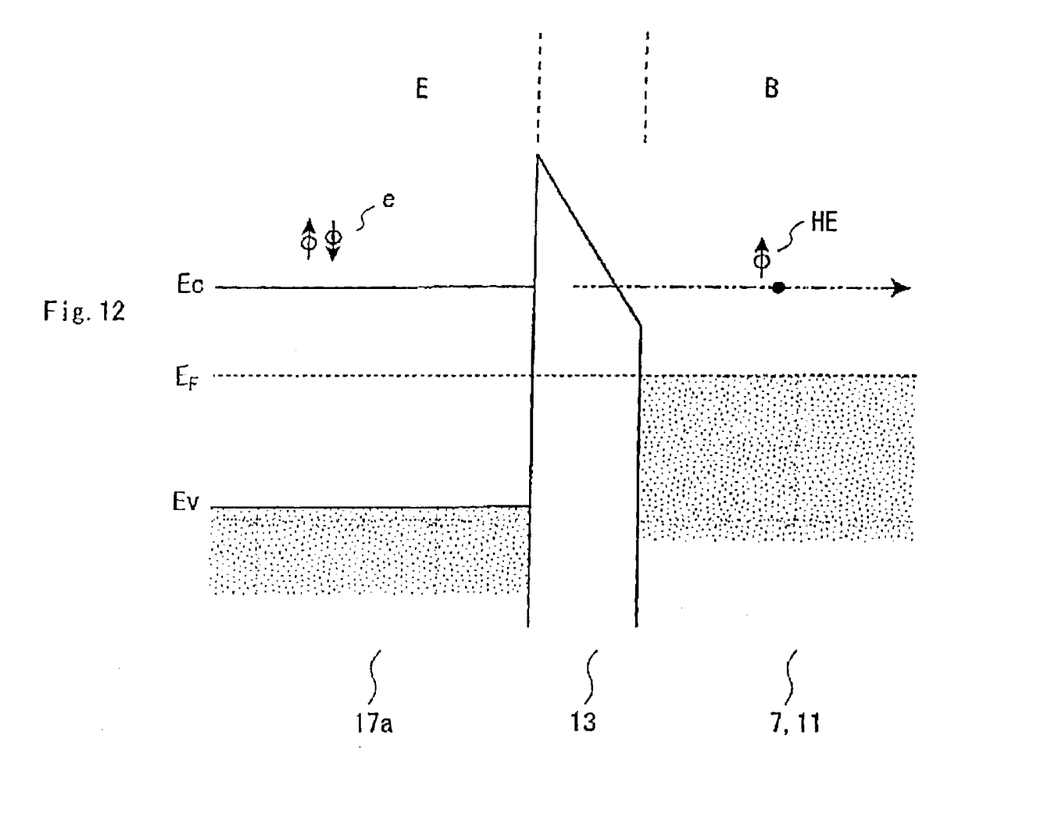
FIG. 12 is an energy band diagram around the tunnel barrier layer 13 of the second embodiment of the present invention.

FIGS. 9 and 10 are schematic cross-sectional views, which show spin valve transistors according to the second embodiment of the invention. In this embodiment, the emitter E is formed of a semiconductor layer 17. The magnetization free layer 11 of the transistor of FIG. 9 is formed on the side of the tunnel barrier layer 13, while the magnetization pinned layer 7 of FIG. 10 is formed on the side of the tunnel barrier layer 13. FIGS. 11 and 12 are diagrams, which show energy band diagrams around the tunnel barrier layer 13 in this embodiment. In FIGS. 11 and 12, $E_c$ indicates the energy level of the conductor band; $E_v$ indicates the energy level of the valance band; and $E_F$ indicates the Fermi energy level.

As is understood from FIG. 11, since the electrons e are emitted from the conduction band of the semiconductor layer 17 of the MIS structure, hot electrons HE of higher energy can be injected even though the applied voltage is low. In the spin valve transistor having the band structure, the tunnel barrier layer 13 is prevented from being deteriorated in the applied electric field, and the transistor of this embodiment has the advantages of high durability and high transfer ratio.

FIG. 12 is an energy diagram of a modification of the MIS structure that comprises an oxide semiconductor layer 17a of a transition metal oxide such as titanium oxide ($TiO_x$), manganese oxide ($MnO_x$) or iron oxide ($FeO_x$). The transition metal oxide used for the layer 17a has a large work function and produces a significant contact potential difference at an interface with the metal layer, thereby forming a high-level internal electric field in the tunnel barrier layer 13 of a dielectric material. The potential barrier of the tunnel barrier layer 13 significantly transforms by the high internal electric field of FIG. 12, therefore increasing the injection efficiency of hot electrons HE.

(Third embodiment)

The spin valve transistor of the above-described embodiments may be carried on a magnetic reproducing head assembly for magnetic storage system. A magnetic reproducing head of the third embodiment of the present invention includes the spin valve transistor of the first or second embodiment.

The operation speed of the magnetic reproducing head is determined according to the time constant $R_tC_f$ of the circuit of FIG. 6. Therefore, in order to increase the resistance $R_t$ of the transistor, the stray capacitance $C_f$ must be reduced.

Figure 13:
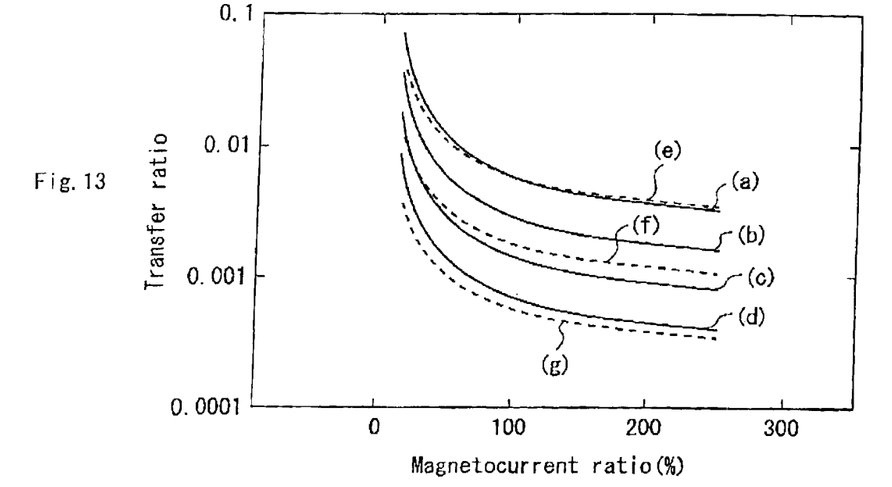
FIG. 13 is a graph illustrating a relationship between a stray capacitance C and an SN ratio.
Figure 14:
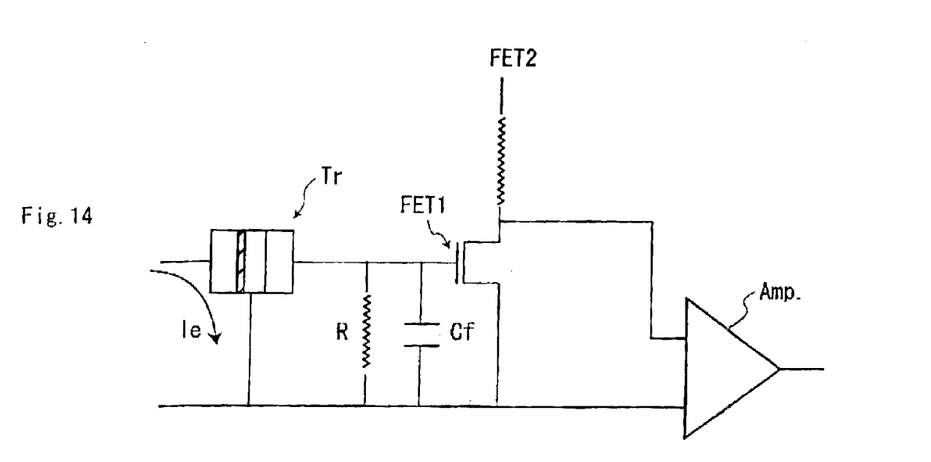
FIG. 14 is a schematic diagram of an equivalent circuit network in which an output of a spin valve transistor Tr is coupled to the gate electrode of a field effect transistor.

FIG. 13 is a graph, which shows the relationship between the stray capacitance Cf and the SN ratio. Each of the solid lines (a), (b), (c) and (d) of FIG. 13 indicates the relationship between the MR ratio (%) and the transfer ratio that satisfies the condition of SN ratio of 30, when Vs is respectively 5 mV ((a)), 10 mV ((b)), 20 mV ((c)) and 40 mV ((d)). Each of the broken lines (e), (f) and (g) of FIG. 13 indicates the relationship between the MR ratio and the transfer ratio that satisfies the condition of SN ratio of 30, when Cf is respectively 1 pF ((e)), 0.1 pF ((f)) and 0.01 pF ((g)), under the condition of $R_tC_f$ is 3.33 ns (300 MHz). For example, when $C_f$ is 0.1 pF, the region above the broken line (f) satisfies the condition of SN ratio >30, in which the device operates at a speed of 300 MHz or more.

As is clear from FIG. 13, the stray capacitance $C_f$ must be reduced for satisfying both high signal voltage (large SN ratio) operation and high-speed operation. The stray capacitance $C_f$ may be most effectively reduced, when the output from the spin valve transistor Tr is connected to the gate electrode of FET1, which is formed on the same chip with the spin valve transistor, therefore the transistor FET1 may be monolithically formed on one and the same GaAs substrate on which the spin valve transistor Tr is formed.

This circuit network attains a stray capacitance Cf of 0.001 pF or less, and achieves both large SN ratio and high-speed operation. Monolithically forming the spin valve transistor Tr and FET1 on one and the same substrate enables device operation in a gigahertz (GHz)-level band, and it produces a magnetic head that enables a recording density of hundreds Gb/inch².

For ensuring the durability of the spin valve transistor Tr, the spin valve transistor Tr is preferably spaced apart from a recording medium and a flux guide may be provided between a magnetic medium facing surface of the head and the spin valve transistor so as to guide a signal magnetic field from a magnetic medium to the spin valve transistor.

Figure 15:
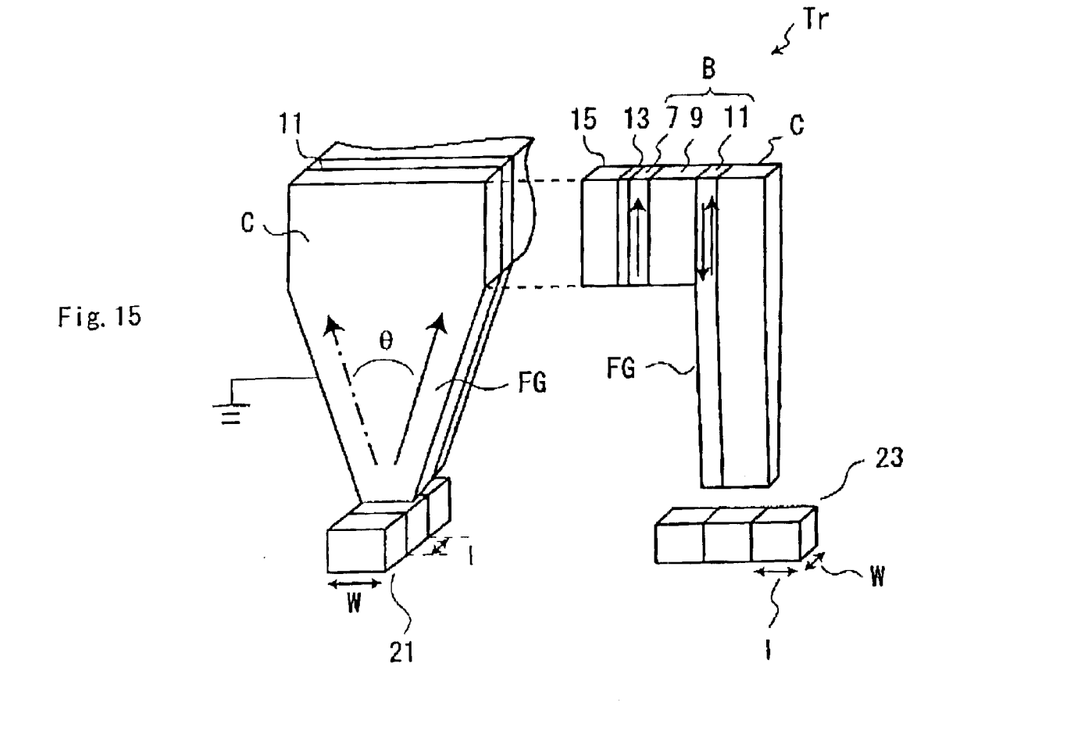
FIG. 15 is a schematic illustration of a magnetic reproducing head which has a flux guide for leading a signal magnetic field from a magnetic media to a spin valve transistor.

FIG. 15 is a schematic view for explaining the structure of a magnetic head, which has the magnetic flux guide extending from a magnetic medium facing surface of the magnetic reproducing head to the spin valve transistor. The left side and the right side of FIG. 15 are perspective views each showing the structure of the same magnetic head. In general, the magnetic head includes a nonmagnetic insulating material that surrounds the magnetic structure of FIG. 15. Numerals 21 and 23 of FIG. 15 indicate three bits line of the recording bits of the magnetic recording medium.

The magnetization free layer 11 of the spin valve transistor Tr of FIG. 15 may extend in the direction toward the recording medium (in the lower direction in FIG. 15) to form a part of the magnetic flux guide FG. Otherwise, a magnetic guide layer may be formed as the flux guide FG and magnetically coupled to the magnetization free layer 11 of the transistor, which is recessed from the magnetic medium facing surface. The collector C of FIG. 15 also extends along with the magnetization free layer 11, thereby supporting the magnetization free layer 11.

The tip of the flux guide FG is tapered to have substantially the same width and/or same length as the track width w and/or the bit length 1 of the magnetic recording bit of FIG. 15, while the remote and recessed end of the flux guide FG has wider width, which is substantially the same width as the magnetization free layer 11 of the recessed spin valve transistor. By employing the tapered shape, the flux guide FG ensures collecting and guiding the signal magnetic field from a small recording bit (for example, a bit length of 20 nm), and leads it to the spin valve transistor Tr.

The flux guide FG is preferably made of a material that fully transfers the signal magnetic field from the recording bits. For this, the material is preferably a magnetic material of high permeability having a low coercive force. Such material may be iron nickel (FeNi) or its equivalents.

The MR ratio of conventional GMR devices and TMR devices is not large enough and if the devices are recessed from the medium facing surface and magnetically coupled to a long flux guide, the reproducing head with the devices cannot attain an appropriate sensitivity. For this reason, it is difficult to recess the GMR and TMR devices from recording media. On the other hand, spin valve transistors having a large MR ratio can be fully spaced apart from magnetic recording medium and the durability of the transistor is therefore improved. The spin valve transistors recessed from the magnetic medium facing surface may be far larger in size than each recording bit, whereby it well attains higher recording density.

EXAMPLE 1

A spin valve transistor of FIG. 3 was fabricated as an Example 1. The semiconductor layer 3 of the collector C was formed of an n⁺-GaAs substrate having a main plane of (001) face; and non-doped GaAs was epitaxially grown for the epitaxially growth layer 5.

An iron layer (Fe), a gold layer (Au) and an iron layer (Fe) were epitaxially grown in this order to form a laminate structure, whereby the magnetization pinned layer 7, the nonmagnetic layer 9 and the magnetization free layer 11 of the base B were laminated and oriented to the face (001).

A tunnel barrier layer 13 of aluminum oxide ($Al_2O_3$) was formed on the base B. The metal layer of the emitter 15 includes aluminum (Al).

For forming these layers in the Example 1, an MBE (Molecular Beam Epitaxy) apparatus was used and a background pressure was set at about $2 \times 10^{-8}$ Pa. The apparatus may have several chambers.

In the first chamber of the MBE apparatus, a non-doped GaAs layer 5 was epitaxially grown on the n⁺-GaAs (001) substrate 3. The thickness of the layer 5 thus formed was about 100 nanometers.

Next, the n+-GaAS substrate 3 was transferred to the second chamber of the MBE apparatus, and an interlayer insulating film of calcium fluoride ($CaF_2$) was formed on the substrate to have a thickness of about 200 nanometers. A first aperture extending to the epitaxially growth layer 5 was formed in the interlayer insulating film, with an aperture size equal to the junction area of the base/collector Schottky junction. The size of the first aperture was about 50 micrometers×50 micrometers.

Next, an iron layer of 1 nm, a gold layer of 5 nm and an iron layer of 1 nm of the base B were formed inside the aperture and the three layers were oriented in a plane (001). A Knudsen cell was used to grow the three layers at a speed of about 0.3 nm/min. The lower iron layer was formed in a magnetic field of 5000 (Oe) so that the layer has a fixed magnetization M1 as the magnetization pinned layer 7.

Then, the tunnel barrier layer 13 of aluminum oxide ($Al_2O_3$) was formed on the base B in the third chamber of the MBE apparatus. The forming atmosphere was of oxygen ($O_2$) whose partial pressure was about $10^{-3}$ (Pa) and an aluminum (Al) source was used, thereby forming the $Al_2O_3$ of a thickness of about 1.5 nm.

Next, the GaAs substrate 3 was again transferred to the second chamber of the MBE apparatus, an interlayer insulating film of calcium fluoride ($CaF_2$) was further formed thereon to have a thickness of about 200 nanometers. A second aperture that reached the tunnel barrier layer 13 was formed in the interlayer insulating film to be aligned with the first aperture, and the size of the second aperture was to be equal to the area of the tunnel junction of between the base B and the emitter E. The size of the second aperture was about 50 micrometers×50 micrometers. Next, an emitter aluminum (Al) layer of the emitter having a thickness of about 100 nanometers was formed over the aperture.

The current-voltage characteristic of the Schottky junction between the base B and the collector C in the thus-fabricated spin valve transistor was measured and the height of the Schottky barrier was about 0.79 eV. The MR ratio and the transfer ratio of the transistor were also measured by applying an in-plane magnetic field to the transistor. The MR ratio of the transistor was 160% and the transfer ratio of the transistor was $1\times10^{-2}$, with as applied voltage $V_E$ of 2.5 V. Thus, the MR ratio and the transfer ratio of the transistor fabricated herein were very high.

EXAMPLE 2

A spin valve transistor of FIG. 3, in which the epitaxially growth layer 5 of the collector C is formed of $Al_xGa_{(1-x)}As$ (x=0.42), was fabricated as an Example 2. In this Example, the spin valve transistor was fabricated in the same manner as Example 1, except that the epitaxially growth layer 5 of the Example 2 was an AlGaAs layer while that of Example 1 was a non-doped GaAs layer.

The current-voltage characteristic of the Schottky junction between the base B and the collector C of the Example 2 was measured and the height of the Schottky barrier was about 1.21 eV. The MR ratio of the transistor was 165% and the transfer ratio thereof was $9.5\times10^{-3}$, with an applied voltage $V_E$ of 2.5 V.

COMPARATIVE EXAMPLE

A comparative example of spin valve transistor, which was provided with an epitaxially growth layer 5 of a silicon-doped GaAs was formed. The silicon doping concentration of the GaAs layer was about $10^{17}$ $cm^{-3}$. Except for the material of the epitaxially growth layer 5, the thickness of the layer 5 and the materials and the thickness of other layers were the same as those of Example 1. The transistor of this comparative example 1 was formed by the same method as of Example 1.

The current-voltage characteristic of the Schottky junction between the base B and the collector C of the comparative transistor was measured. The height of the Schottky barrier was about 0.62 eV. The MR ratio of the transistor was about 150% and the transfer ratio thereof was $1.1\times10^{-2}$ with an applied voltage $V_E$ of 2.5 V.

EXAMPLE 3

A spin valve transistor of FIG. 9 having an energy diagram of FIG. 12 was fabricated as an Example 3. The transition metal oxide semiconductor layer 17a of iron oxide ($FeO_x$) was formed as the emitter 17 of FIG. 9. The transistor of this Example differed from that of Example 1 only in the material of the emitter. The two transistors were the same in other materials and the thickness of their layers.

In this Example, an iron layer was formed in the second chamber of the MBE apparatus and then oxidized in the third chamber of the MBE apparatus by introducing oxygen into the third chamber, thereby forming the iron oxide layer 17a.

Figure 16:
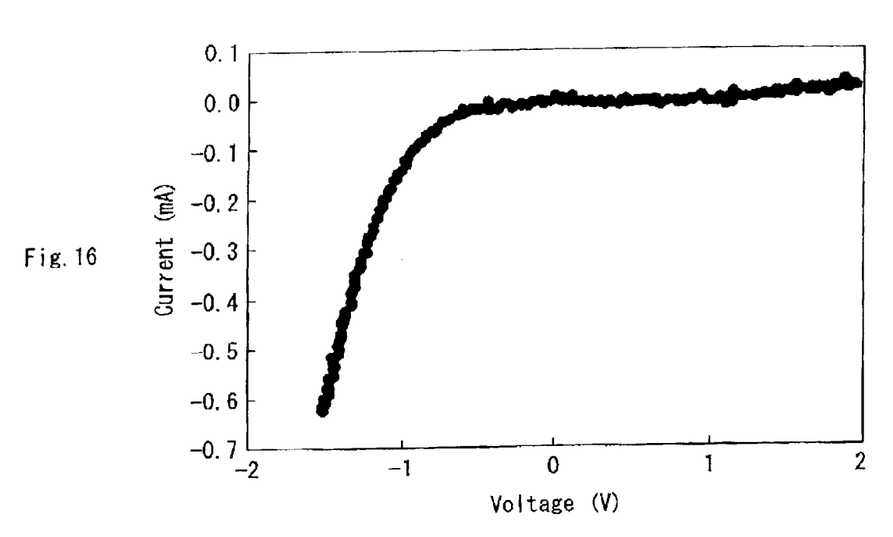
FIG. 16 is a graph showing the current-voltage characteristic between the emitter E and the base B of the spin valve transistor according to Example 3 of the present invention.

The current-voltage characteristic between the emitter E and the base B of the transistor had a mode of MIS structure of FIG. 16. Even when a low bias voltage $V_E$ of 1.5 V was applied thereto, the transistor had a high transfer ratio of about $9.5\times10^{-2}$ and a relatively high MR ratio of about 160%.

As described hereinabove, the transistor of the invention may be used as a sensor device of magnetic reproducing head. The magnetic reproducing head having the spin valve transistor may be used in a magnetic information storage system such as hard disc drive and other storage system. In addition, the spin valve transistor of the invention may also be used as the memory cell device of a memory system, such as a magnetic ROM (Read Only Memory) and a magnetic RAM (Random Access Memory).

Some preferred embodiments of the invention have been described hereinabove with reference to the embodiments and examples; however, the invention is not limited to the described embodiments and examples of the invention. For example, the thickness and the materials of each layer and the size of the transistor may be changed. The shapes and the materials of the substrates, the electrodes, the conductivity types, the dopants and the insulator tunnel barrier structures that are applicable to the transistor may be appropriately selected to modify the embodiments and the examples of the invention.

Directly as it is or after being suitably modified, the structure of the spin-valve film employed in GMR devices may also be used in fabricating the spin valve transistor of the invention. Regarding the materials of the magnetization free layer, the nonmagnetic layer, the magnetization pinned layer, the emitter layer and the collector layer of the transistor, these layers may have a single-layered structure or a multi-layered structure of different layers.

The wording "on" used herein for indicating the positional relationship of the two layers does not limit that two layers are in direct contact with each other, however another layer may be interposed between the two layers.

As described hereinabove with reference to some preferred embodiments, the present invention provides a spin valve transistor which has a high SN ratio and enables a high-speed reading-out operation.

Numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A spin valve transistor, comprising:
   a collector having a first semiconductor layer of first composition and a second semiconductor layer formed on the first semiconductor layer, the second semiconductor layer comprising an epitaxially growth layer of a second composition different from the first composition;
   a base formed on the second semiconductor layer and having a magnetization pinned layer, a nonmagnetic layer and a magnetization free layer, the magnetization pinned layer having a magnetization substantially fixed in an applied magnetic field, and the magnetization free layer having a magnetization free to rotate under the applied magnetic field;
   a tunnel barrier layer of dielectric material formed on the base; and
   an emitter formed on the tunnel barrier layer.

2. A spin valve transistor of claim 1, wherein the first semiconductor layer has a first electron affinity and the second semiconductor layer has a second electron affinity, and the second electron affinity is smaller than the first electron affinity.

3. A spin valve transistor of claim 1, wherein the first semiconductor layer has a first energy band gap and the second semiconductor layer has a second energy band gap, and the second energy band gap is larger than the first energy band gap.

4. A spin valve transistor of claim 1, wherein the first semiconductor layer contains silicon, germanium, or gallium arsenide.

5. A spin valve transistor of claim 1, wherein the tunnel barrier layer contains a dielectric material.

6. A spin valve transistor, comprising:
   a collector;
   a base formed on the collector and having a magnetization pinned layer, a nonmagnetic layer and a magnetization free layer, the magnetization pinned layer having a magnetization substantially pinned in an applied magnetic field, and the magnetization free layer having a magnetization free to rotate in the applied magnetic field;
   a tunnel barrier layer of dielectric material formed on the base; and
   an emitter formed on the tunnel barrier layer and comprising a semiconductor layer, the semiconductor layer containing an oxide of transitional metal and contacting the tunnel barrier layer.

7. A spin valve transistor of claim 6, wherein the oxide of transitional metal is a semiconductor material selected from the group consisting of a titanium oxide, a manganese oxide and an iron oxide.

8. A magnetic reproducing head, comprising:
   a spin valve transistor comprising,
      a collector having a first semiconductor layer of first composition and a second semiconductor layer formed on the first semiconductor layer, the second semiconductor layer comprising an epitaxially grown layer of a second composition different from the first composition,
      a base formed on the second semiconductor layer and having a magnetization pinned layer, a nonmagnetic layer and a magnetization free layer, the magnetization pinned layer having a magnetization substantially fixed in an applied magnetic field, and the magnetization free layer having a magnetization free to rotate under the applied magnetic field,
      a tunnel barrier layer of dielectric material formed on the base, and
      an emitter formed on the tunnel barrier layer.

9. A magnetic reproducing head of claim 8, comprising an electrical field effect transistor, wherein the collector is electrically coupled to the electrical field effect transistor, and the spin valve transistor and the electrical field effect transistor are formed on the same substrate.

10. A magnetic reproducing head of claim 8, further comprising a magnetic flux guide magnetically coupled to the magnetization free layer.

11. A spin valve transistor of claim 8, wherein the first semiconductor layer has a first electron affinity and the second semiconductor layer has a second electron affinity, and the second electron affinity is smaller than the first electron affinity.

12. A spin valve transistor of claim 8, wherein the first semiconductor layer has a first energy band gap and the second semiconductor layer has a second energy band gap, and the second energy band gap is larger than the first energy band gap.

13. A spin valve transistor of claim 8, wherein the first semiconductor layer contains silicon, germanium, or gallium arsenide.

14. A spin valve transistor of claim 8, wherein the tunnel barrier layer contains a dielectric material.

15. A magnetic reproducing head, comprising:
   a spin valve transistor comprising,
      a collector,
      a base formed on the collector and having a magnetization pinned layer, a nonmagnetic layer and a magnetization free layer, the magnetization pinned layer having a magnetization substantially pinned in an applied magnetic field, and the magnetization free layer having a magnetization free to rotate in the applied magnetic field,
      a tunnel barrier layer of dielectric material formed on the base, and
      an emitter formed on the tunnel barrier layer and comprising a semiconductor layer, the semiconductor layer containing an oxide of transitional metal and contacting the tunnel barrier layer.

16. A magnetic reproducing head of claim 15, comprising an electrical field effect transistor, wherein the collector is electrically coupled to the electrical field effect transistor, and the spin valve transistor and the electrical field effect transistor are formed on the same substrate.

17. A magnetic reproducing head of claim 15, further comprising a magnetic flux guide magnetically coupled to the magnetization free layer.

18. A spin valve transistor of claim 15, wherein the oxide of transitional metal comprises a semiconductor material selected from the group consisting of a titanium oxide, a manganese oxide and an iron oxide.

19. A magnetic information storage system, comprising:
   a spin valve transistor, comprising:
      a collector having a first semiconductor layer of first composition and a second semiconductor layer formed on the first semiconductor layer, the second semiconductor layer comprising an epitaxially growth layer of a second composition different from the first composition, a base formed on the second semiconductor layer and having a magnetization pinned layer, a nonmagnetic layer and a magnetization free layer, the magnetization pinned layer having a magnetization substantially fixed in an applied magnetic field, and the magnetization free layer having a magnetization free to rotate under the applied magnetic field, a tunnel barrier layer of dielectric material formed on the base, and an emitter formed on the tunnel barrier layer.

20. A magnetic information storage system, comprising;

a spin valve transistor, comprising, a collector, a base formed on the collector and having a magnetization pinned layer, a nonmagnetic layer and a magnetization free layer, the magnetization pinned layer having a magnetization substantially pinned in an applied magnetic field, and the magnetization free layer having a magnetization free to rotate in the applied magnetic field, a tunnel barrier layer of dielectric material formed on the base, and an emitter formed on the tunnel barrier layer and comprising a semiconductor layer, the semiconductor layer containing an oxide of transitional metal and contacting the tunnel barrier layer.

* * * * *